(12) United States Patent
Huang et al.

(10) Patent No.: US 11,422,819 B2
(45) Date of Patent: Aug. 23, 2022

(54) POWER EFFICIENT MULTI-BIT STORAGE SYSTEM

(71) Applicant: Taiwan Semiconductor Manufacturing Company Limited, Hsinchu (TW)

(72) Inventors: Kai-Chi Huang, Hsinchu (TW); Chi-Lin Liu, New Taipei (TW); Wei-Hsiang Ma, Taipei (TW); Shang-Chih Hsieh, Yangmei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 17 days.

(21) Appl. No.: 16/900,514

(22) Filed: Jun. 12, 2020

(65) Prior Publication Data

US 2021/0389952 A1    Dec. 16, 2021

(51) Int. Cl.
*G06F 9/30* (2018.01)
*G06F 9/38* (2018.01)
*G11C 11/56* (2006.01)

(52) U.S. Cl.
CPC ........ *G06F 9/3844* (2013.01); *G06F 9/30043* (2013.01); *G06F 9/30141* (2013.01); *G06F 9/3863* (2013.01); *G11C 11/5628* (2013.01)

(58) Field of Classification Search
CPC ............. G06F 9/30043; G06F 9/30141; G06F 9/3844; G06F 9/3863; G11C 11/5628
See application file for complete search history.

(56) References Cited

U.S. PATENT DOCUMENTS

| | | | | |
|---|---|---|---|---|
| 7,782,108 B2* | 8/2010 | Sedlak | ............. | H03K 3/356173 327/211 |
| 2008/0301594 A1* | 12/2008 | Jiang | ..................... | G06F 30/396 716/134 |
| 2014/0225655 A1* | 8/2014 | Rasouli | .................. | H03K 5/135 327/161 |
| 2015/0022252 A1* | 1/2015 | Venas | ................ | H03K 19/0016 327/225 |
| 2016/0049937 A1* | 2/2016 | Tong | ..................... | G06F 1/3237 327/199 |

* cited by examiner

*Primary Examiner* — Jacob Petranek
(74) *Attorney, Agent, or Firm* — Foley & Lardner LLP

(57) ABSTRACT

Disclosed herein are embodiments related to a power efficient multi-bit storage system. In one configuration, the multi-bit storage system includes a first storage circuit, a second storage circuit, a prediction circuit, and a clock gating circuit. In one aspect, the first storage circuit updates a first output bit according to a first input bit, in response to a trigger signal, and the second storage circuit updates a second output bit according to a second input bit, in response to the trigger signal. In one aspect, the prediction circuit generates a trigger enable signal indicating whether at least one of the first output bit or the second output bit is predicted to change a state. In one aspect, the clock gating circuit generates the trigger signal based on the trigger enable signal.

20 Claims, 9 Drawing Sheets

POWER EFFICIENT MULTI-BIT STORAGE SYSTEM

BACKGROUND

Developments in an integrated circuit design allow an integrated circuit to perform complex functionalities. In one aspect, an integrated circuit includes digital logic circuits that can perform logic computations based on electrical signals (e.g., voltage or current) representing corresponding bits of data. For example, a signal having 1V can represent a state or a logic value '1', where a signal having 0V can represent a state or a logic value '0'. In various applications, synchronous logic circuits can perform various logic computations synchronously based on a clock signal. To enable synchronous logic computations, flip flops or latches can store or hold data for a time period, according to the clock signal. Data held or stored by the flip flops or the latches enable one or more logic computations to be performed in a reliable manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
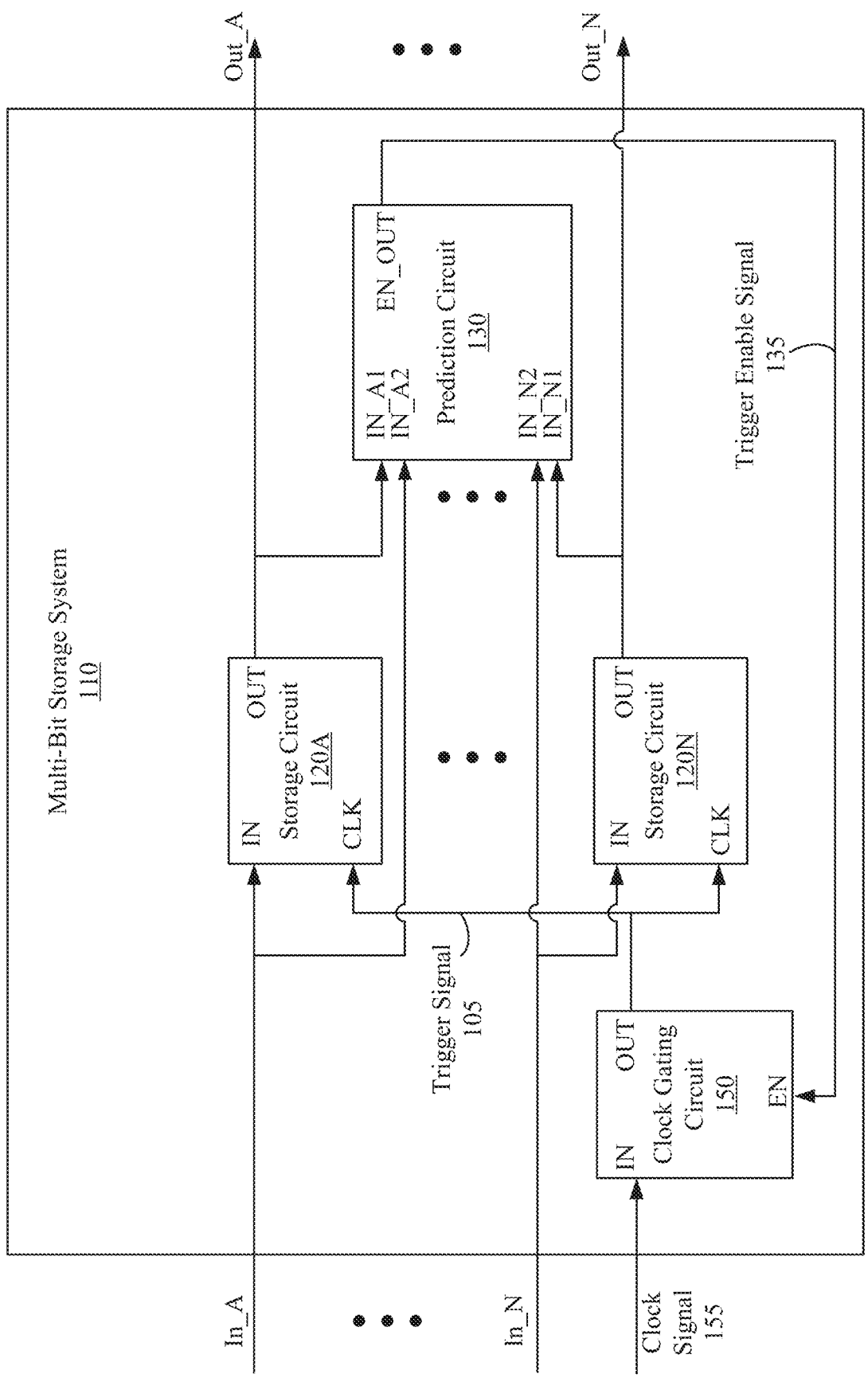
FIG. 1 is a schematic diagram of a multi-bit storage system, in accordance with one implementation.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are embodiments related to an integrated circuit including a power efficient multi-bit storage system. In one configuration, the multi-bit storage system includes a first storage circuit, a second storage circuit, a prediction circuit, and a clock gating circuit. In one aspect, the first storage circuit updates a first output bit according to a first input bit, in response to a trigger signal, and the second storage circuit updates a second output bit according to a second input bit, in response to the trigger signal. In one aspect, the prediction circuit generates a trigger enable signal indicating whether at least one of the first output bit or the second output bit is predicted to change a state. In one aspect, the clock gating circuit generates the trigger signal based on the trigger enable signal.

Advantageously, the disclosed multi-bit storage system can operate in a power efficient manner. In one implementation, multiple storage circuits (e.g., flip flops) can synchronously operate according to a clock signal from a common clock driver circuit (e.g., one or more inverters). However, when the common clock driver circuit provides periodic pulses or a clock signal to a large number of storage circuits (e.g., 7 or more) at a high frequency or a high data rate (e.g., over 1 GHz or 1 Gbps), such common clock driver circuit may consume a large amount of power because of a capacitive load at the output of the common clock driver circuit. For example, a periodic toggling of a voltage at the output of the common clock driver circuit connected to a large number of storage circuits may cause a large amount of power consumption. In various embodiments disclosed herein, whether at least one of multiple output bits of storage circuits (e.g., flip flops) will change a state can be predicted. Moreover, a clock signal or a trigger signal that prompts the storage circuits to update output bits the storage circuits can be dynamically or adaptively provided to the storage circuit, in response to a prediction that the at least one of multiple output bits of the storage circuits will change a state. Accordingly, frequent toggling by a common clock driver circuit can be obviated to achieve power efficiency. In one example, by dynamically or adaptively prompting or causing multiple storage circuits to update output bits based on the predictions as disclosed herein, power consumption can be reduced up to 64% compared to providing a periodic pulses or a clock signal to the multiple storage circuits at a high frequency or a high data rate (e.g., over 1 GHz or 1 Gbps).

FIG. 1 is a schematic diagram of a multi-bit storage system 110, in accordance with one implementation. In some embodiments, the multi-bit storage system 110 is implemented as an integrated circuit. In some embodiments, the multi-bit storage system 110 is implemented as two or more separate systems or circuits. In some embodiments, the multi-bit storage system 110 includes N number of storage circuits 120A . . . 120N. N may be an even number (e.g., 4, 8, 16, 32, etc.) or any positive integer number. In some embodiments, the multi-bit storage system 110 also includes a prediction circuit 130, and a clock gating circuit 150. These components may operate together to predict whether at least one of outputs bits stored by the storage circuits 120A . . . 120N will change a state, and dynamically or adaptively provide a trigger signal 105 to the storage circuits 120A . . . 120N to update the output bits Out_A . . . Out_N stored by the storage circuits 120A . . . 120N. In one aspect, the multi-bit storage system 110 operates as a multi-bit flop. In some embodiments, the multi-bit storage system 110 includes more, fewer, or different components than shown in FIG. 1.

In some embodiments, the storage circuits 120A . . . 120N are circuits that can store data for a time period. Each storage circuits 120 . . . 120N may be embodied as a flip flop, a latch, or any synchronous circuit that can hold data according to a trigger signal 105. In some embodiments, the storage circuits 120A . . . 120N can be substituted by any component that can perform the functionalities of the storage circuits 120A . . . 120N described herein. In one example, a storage circuit 120X includes an input port IN to receive an input bit IN_X, a clock port CLK to receive the trigger signal 105, and an output port OUT to provide an output bit Out_X. In one example, the storage circuit 120X implemented as a flip flop updates the output bit Out_X at the output port OUT by replacing the output bit Out_X with the input bit In_X received at the input port, in response to detecting a predetermined edge (e.g., a rising edge or a falling edge) of the trigger signal 105. In one example, the storage circuit 120X implemented as the flip flop may maintain or hold the output bit Out_X at the output port OUT, in response to not detecting the predetermined edge (e.g., a rising edge or a falling edge) of the trigger signal 105.

In some embodiments, the prediction circuit 130 is a circuit that predicts whether at least one of output bits Out_A . . . Out_N of the storage circuits 120A . . . 120N will change a state, and generates a trigger enable signal 135 according to the prediction. In some embodiments, the prediction circuit 130 can be substituted by any component that can perform the functionalities of the prediction circuit 130 described herein. In one configuration, the prediction circuit 130 includes input ports IN_A1 . . . IN_N1 coupled to output ports OUT of the corresponding storage circuits 120A . . . 120N, input ports IN_A2 . . . IN_N2 coupled to input ports IN of the corresponding storage circuits 120A . . . 120N, and an output port EN_OUT coupled to an enable port EN of the clock gating circuit 150. In this configuration, the prediction circuit 130 may determine, for each output bit Out_X, whether a state of the output bit Out_X will change a state by comparing the output bit Out_X with a corresponding input bit In_X. According to the determination, the prediction circuit 130 may determine whether at least one of the output bits Out_A . . . Out_N of the storage circuits 120A . . . 120N will change a state, and generate the trigger enable signal 135 according to the determination. For example, the prediction circuit 130 generates the trigger enable signal 135 having a first state (e.g., logic value '1') indicating that at least one of the output bits Out_A . . . Out_N of the storage circuits 120A . . . 120N will change a state. For example, the prediction circuit 130 generates the trigger enable signal 135 having a second state (e.g., logic value '0') indicating that states of the output bits Out_A . . . Out_N of the storage circuits 120A . . . 120N will remain unchanged. The prediction circuit 130 may provide the trigger enable signal 135 to the clock gating circuit 150 to enable or disable the clock gating circuit 150. Detailed description on operations and configurations of the prediction circuit 130 are provided below with respect to FIGS. 2 through 7 below.

In some embodiments, the clock gating circuit 150 is a circuit that dynamically or adaptively generates the trigger signal 105 according to the clock signal 155. The clock signal 155 may have periodic pulses at a high frequency (e.g., 1 GHz or higher). The clock gating circuit 150 may be implemented as a latch or a flip flop. In some embodiments, the clock gating circuit 150 can be substituted by any component that can perform the functionalities of the clock gating circuit 150 described herein. In one configuration, the clock gating circuit 150 includes an input port to receive the clock signal 155, an enable port EN coupled the output port EN_OUT of the prediction circuit 130, an output port OUT coupled to the clock ports CLK of the storage circuits 120A . . . 120N. In this configuration, the clock gating circuit 150 is dynamically or adaptively enabled or disabled according to the trigger enable signal 135 to generate the trigger signal 105. In one example, the clock gating circuit 150 is enabled, in response to the trigger enable signal 135 having the first state (e.g., logic value '1'). For example, when the clock gating circuit 150 is enabled, the clock gating circuit 150 may wait for a rising edge of the clock signal 155. In response to the rising edge of the clock signal 155 while the clock gating circuit 150 is enabled, the clock gating circuit 150 may change a state of the trigger signal 105, for example, from the second state (e.g., logic value '0') to the first state (e.g., logic value '1'). In one example, the clock gating circuit 150 is disabled, in response to the trigger enable signal 135 having the second state (e.g., logic value '0'). When the clock gating circuit 150 is disabled, the clock gating circuit 150 may wait for the falling edge of the clock signal 155. In response to the falling edge of the clock signal 155 while the clock gating circuit 150 is disabled, the clock gating circuit 150 may output a predetermined state (e.g., logic value '0') as the trigger signal 105 at the output port OUT. In one aspect, a rising edge of the trigger signal 105 may prompt or cause the storage circuits 120A . . . 120N to update the output bits Out_A . . . Out_N according to the input bits In_A . . . In_N.

Advantageously, the multi-bit storage system 110 can operate in a power efficient manner. In one aspect, the clock gating circuit 150 may be connected a large number (e.g., 8, 16, or 32) of the storage circuits 120 to provide the trigger signal 105. Frequent or periodic toggling at the output port OUT of the clock gating circuit 150 may lead to a large amount of power consumption. By dynamically or adaptively enabling and disabling the clock gating circuit 150 according to predictions from the prediction circuit 130, a number of toggles (or changes in states) of the trigger signal can be reduced to achieve power efficiency.

Figure 2:
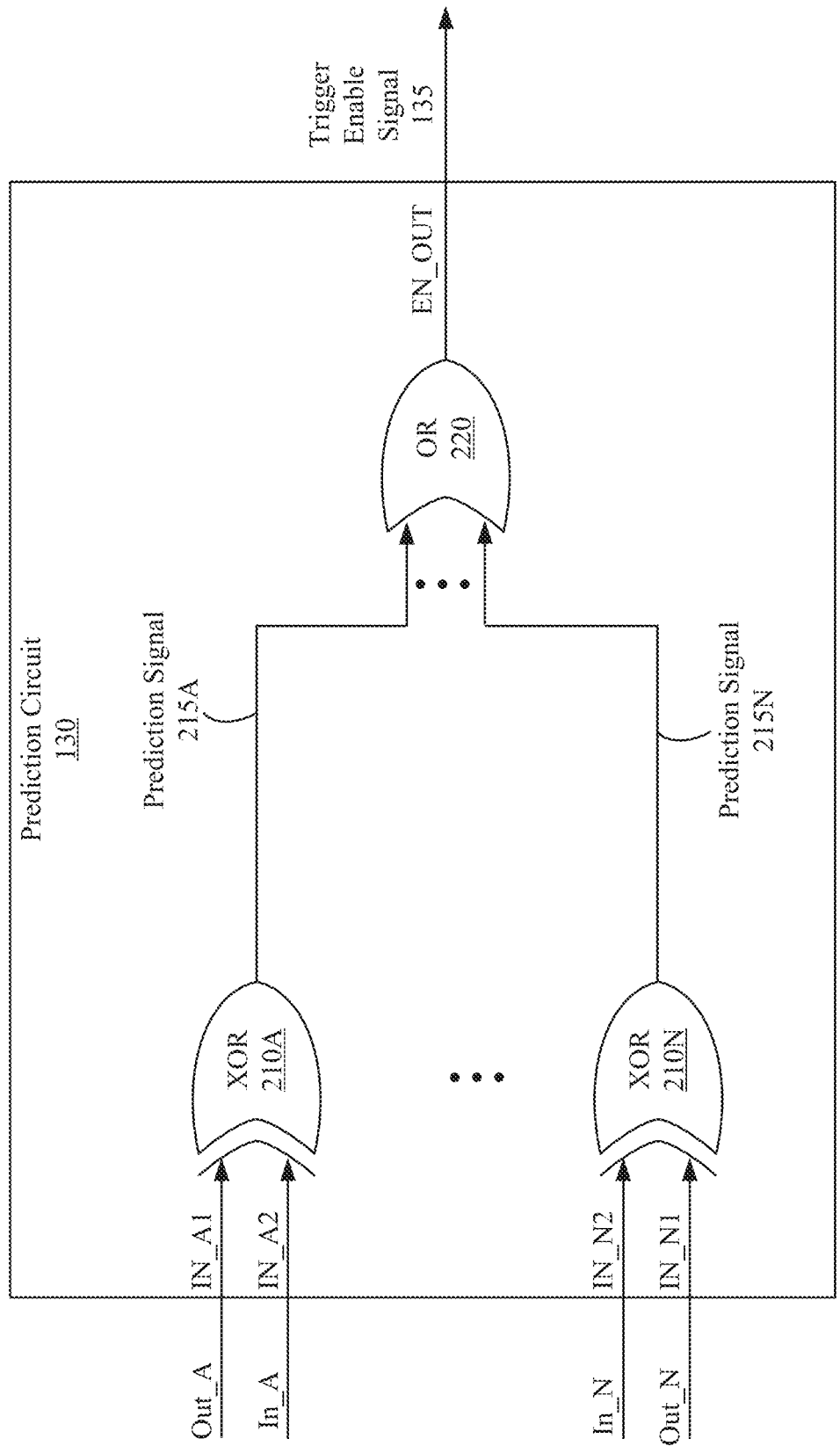
FIG. 2 is a schematic diagram of an example prediction circuit of the multi-bit storage system shown in FIG. 1, in accordance with some embodiments.

FIG. 2 is a schematic diagram of an example prediction circuit 130 of the multi-bit storage system 110 shown in FIG. 1, in accordance with some embodiments. In some embodiments, the prediction circuit 130 includes N number of XOR gates and an OR gate 220. These components may operate together to predict whether at least one of output bits Out_A . . . Out_N of the storage circuits 120A . . . 120N will change a state, and generates a trigger enable signal 135 according to the prediction. In some embodiments, the prediction circuit 130 includes more, fewer, or different components than shown in FIG. 2.

In some embodiments, each of the XOR gates 210A . . . 210N is a circuit that predicts whether a corresponding one of the outputs bits Out_A . . . Out_N will change a state. In some embodiments, the XOR gates 210A . . . 210N can be substituted by any components that can perform the functionalities of the XOR gates 210A . . . 210N described herein. In one configuration, each XOR gate 210X includes a first input port IN_X1 coupled to the output port OUT of the corresponding storage circuit 120X, a second input port IN_X2 coupled to the input port IN of the corresponding storage circuit 120X, and an output port coupled to a corresponding input port of the OR gate 220. In this configuration, the XOR gate 210X receives the output bit Out_X of the storage circuit 120X at the first input port IN_X1 and receives the input bit In_X of the storage circuit 120X at the second input port IN_X2. Moreover, the XOR gate 210X compares the output bit Out_X of the storage circuit 120X with the input bit In_X of the storage circuit 120X, and generates a prediction signal 215X according to the comparison. For example, in response to the input bit In_X and the output bit Out_X of the storage circuit 120X being different, the XOR gate 210X may generate the prediction signal 215X having a first state (e.g., logic value '1') indicating that a state of the output bit Out_X of the storage circuit 120X is predicted to be changed. For example, in response to the input bit In_X and the output bit Out_X of the storage circuit 120X being equal to each other, the XOR gate 210X may generate the prediction signal 215X having a second state (e.g., logic value '0') indicating that the state of the output bit Out_X of the storage circuit 120X is predicted to remain unchanged. Each XOR gate 210X may provide the corresponding prediction signal 215X to the OR gate 220.

In some embodiments, the OR gate 220 is a circuit that receives the prediction signals 215A . . . 215N from the XOR gates 210A . . . 210N, and generates the trigger enable signal 135 according to the prediction signals 215A . . . 215N. In some embodiments, the OR gate 220 can be substituted by any component that can perform the functionalities of the OR gate 220 described herein. In one configuration, the OR gate 220 includes N number of input ports coupled to output ports of the corresponding XOR gates 210A . . . 210N and the output port EN_OUT coupled to the enable port EN of the clock gating circuit 150. In this configuration, the OR gate 220 may determine whether at least one of the output bits Out_A . . . Out_N of the storage circuits 120A . . . 120N will change a state according to the prediction signals 215A . . . 215N, and generate the trigger enable signal 135 according to the determination. For example, in response to at least one of the prediction signals 215A . . . 215N having a first state (e.g., logic value '1'), then the OR gate 220 may generate the trigger enable signal having the first state (e.g., logic value '1') to enable the clock gating circuit 150. For example, in response to each of the prediction signals 215A . . . 215N having a second state (e.g., logic value '0'), then the OR gate 220 may generate the trigger enable signal having the second state (e.g., logic value '0') to disable the clock gating circuit 150.

Figure 3:
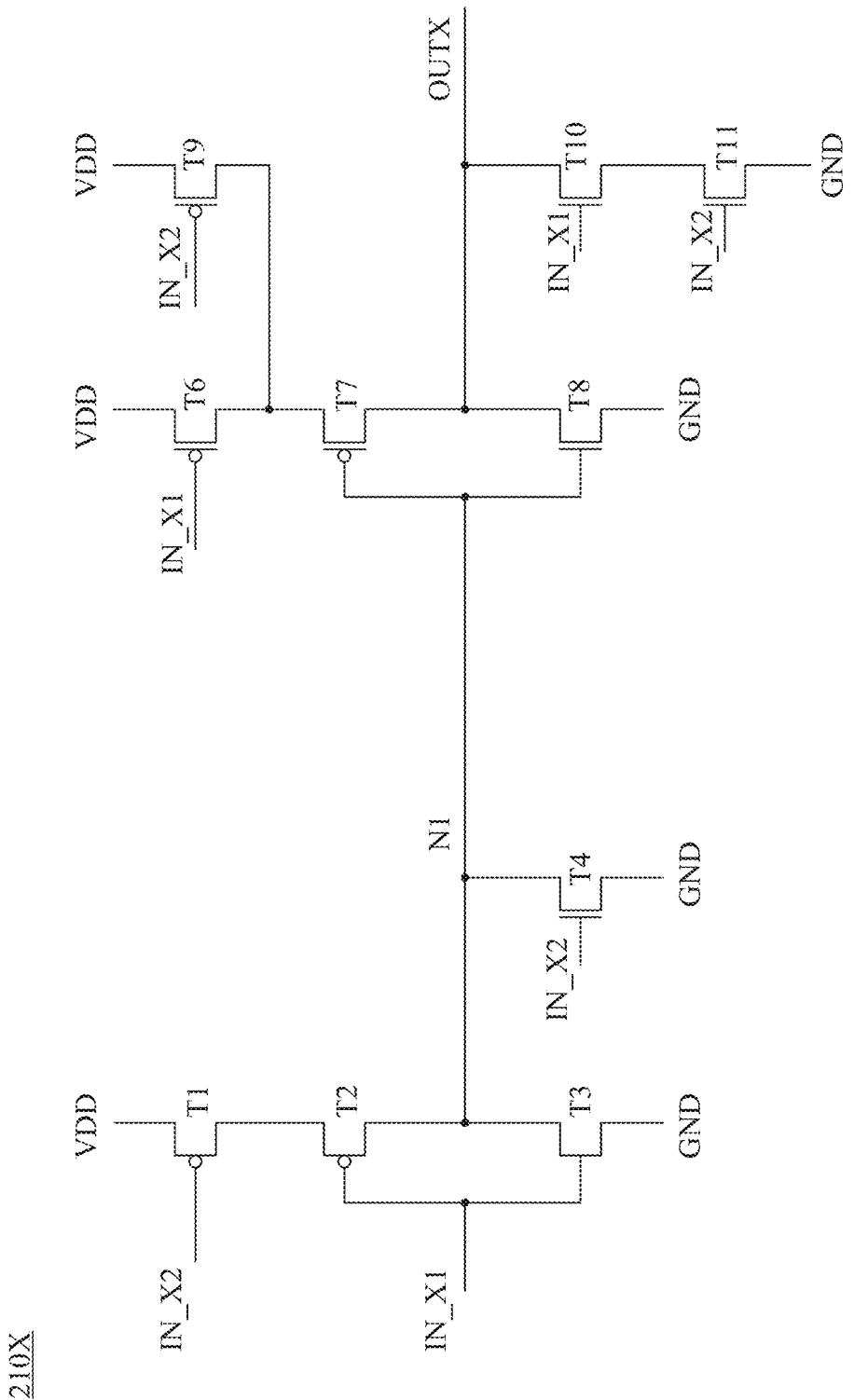
FIG. 3 is a schematic diagram of an XOR gate of the prediction circuit shown in FIG. 2, in accordance with some embodiments.

FIG. 3 is a schematic diagram of an XOR gate 210X of the prediction circuit 130 shown in FIG. 2, in accordance with some embodiments. In some embodiments, the XOR gate 210X includes transistors T1 . . . T11. The transistors T1, T2, T6, T7, T9 may be P-type transistors (e.g., P-type MOSFETs or P-type FinFETs), and transistors T3, T4, T8, T10, T11 may be N-type transistors (e.g., N-type MOSFETs or N-type FinFETs). These components may operate together to compare the input bit In_X of the storage circuit 120X received at an input port IN_X2 and the output bit Out_X of the storage circuit 120X received at an input port IN_X1, and generate a prediction signal 215X at an output port OUTX. In some embodiments, the XOR gate 210 includes more, fewer, or different components than shown in FIG. 3.

In one configuration, the transistor T1 includes a gate electrode coupled to the input port IN_X2, a source electrode coupled to a power rail VDD providing a supply voltage, and a drain electrode. In one configuration, the transistor T2 includes a gate electrode coupled to the input port IN_X1, a source electrode coupled to the drain electrode of the transistor T1, and a drain electrode coupled to a node N1. In one configuration, the transistor T3 includes a gate electrode coupled to the input port IN_X1, a source electrode coupled to a ground rail GND providing a ground voltage, and a drain electrode coupled to the node N1. In one configuration, the transistor T4 includes a gate electrode coupled to the input port IN_X2, a source electrode coupled to the ground rail GND, and a drain electrode coupled to the node N1.

In one configuration, the transistor T6 includes a gate electrode coupled to the input port IN_X1, and a source electrode coupled to the power rail VDD. In one configuration, the transistor T9 includes a gate electrode coupled to the input port IN_X2, a source electrode coupled to the power rail VDD, and a drain electrode coupled to a drain electrode of the transistor T6. In one configuration, the transistor T7 includes a gate electrode coupled to the node N1, a source electrode coupled to the drain electrodes of the transistors T6, T9, and a drain electrode coupled to the output port OUTX. In one configuration, the transistor T8 includes a gate electrode coupled to the node N1, a source electrode coupled to the ground rail GND, and a drain electrode coupled to the output port OUTX. In one configuration, the transistor T11 includes a gate electrode coupled to the input port IN_X2, and a source electrode coupled to the ground rail GND. In one configuration, the transistor T10 includes a gate electrode coupled to the input port IN_X1, a source electrode coupled to the drain electrode of the transistor T11, and a drain electrode coupled to the output port OUTX.

In this configuration, the XOR gate 210X can compare the input bit In_X of the storage circuit 120X received at the input port IN_X2 and the output bit Out_X of the storage circuit 120X received at the input port IN_X1, and generate the prediction signal 215X at the output port OUTX. For example, in response to the input bit In_X and the output bit Out_X of the storage circuit 120X being different, the XOR gate 210X may generate the prediction signal 215X having a first state (e.g., logic value '1') indicating that a state of the output bit Out_X of the storage circuit 120X is predicted to be changed. For example, in response to the input bit In_X and the output bit Out_X of the storage circuit 120X being equal to each other, the XOR gate 210X may generate the prediction signal 215X having a second state (e.g., logic value '0') indicating that the state of the output bit Out_X of the storage circuit 120X is predicted to remain unchanged.

Figure 4:
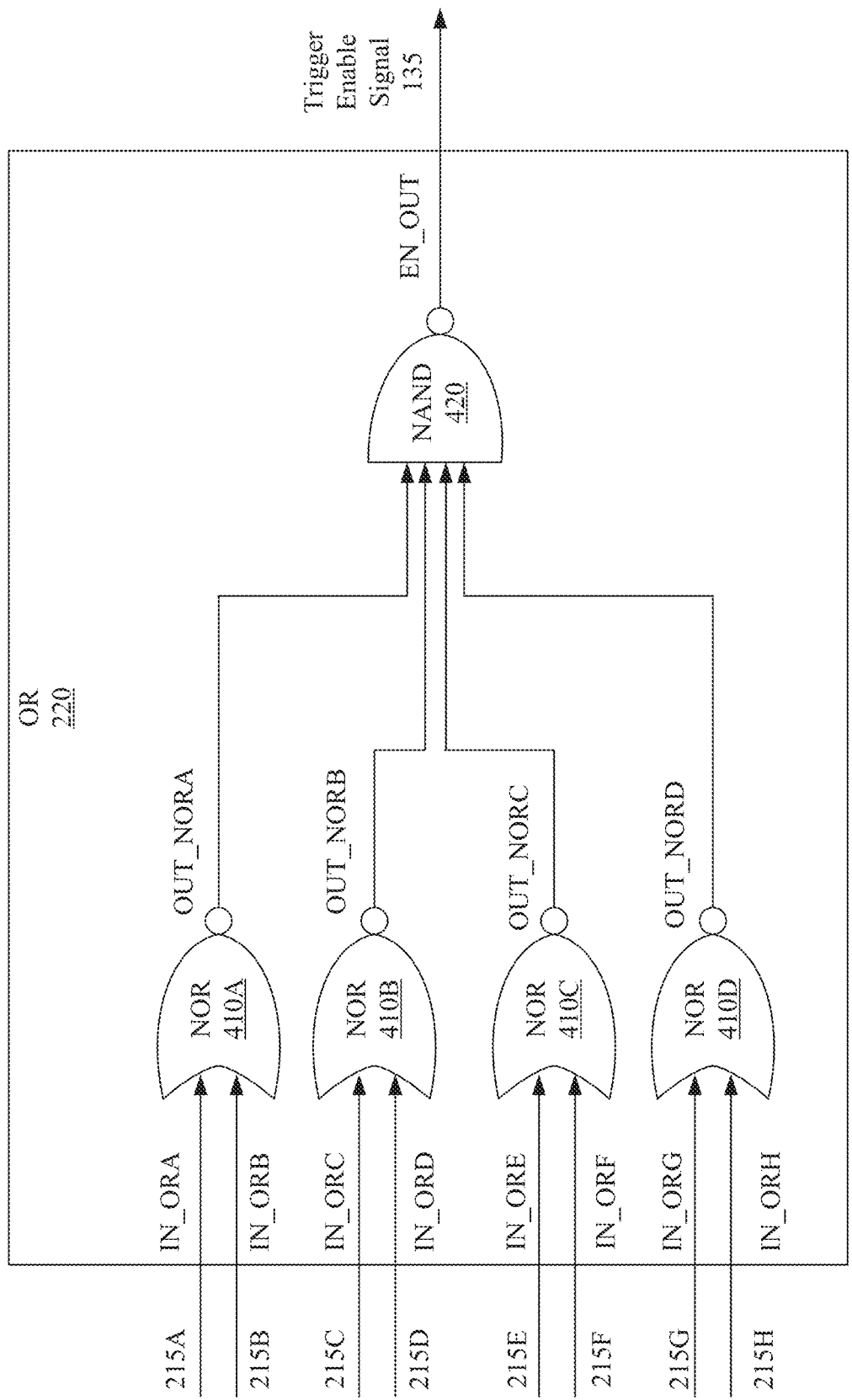
FIG. 4 is a schematic diagram of an OR gate of the prediction circuit shown in FIG. 2, in accordance with some embodiments.

FIG. 4 is a schematic diagram of an OR gate 220 of the prediction circuit 130 shown in FIG. 2, in accordance with some embodiments. In some embodiments, the OR gate 220 shown in FIG. 4 is an 8-input OR gate. In other embodiments, the OR gate 220 may have more or different number inputs than shown in FIG. 4. In one aspect, the OR gate 220 includes first stage two-input NOR gates 410A, 410B, 410C, 410D and a second stage four-input NAND gate 420. These components may operate together to perform an OR operation on the prediction signals 215A . . . 215H. In other embodiments, the OR gate 220 includes more, fewer, or different components than shown in FIG. 4.

In one configuration, the two input NOR gate 410A includes a first input port IN_ORA coupled to the output port of the XOR gate 210A to receive the prediction signal 215A, a second input port IN_ORB coupled to the output port of the XOR gate 210B to receive the prediction signal 215B, and an output port OUT_NORA. In this configuration, the NOR gate 410A may perform a NOR logic operation on the prediction signals 215A, 215B, and output the result of the NOR logic operation at the output port OUT_NORA. The NOR gate 410B may be configured in a similar manner as the NOR gate 410A, and perform a NOR operation on prediction signals 215C, 215D. In addition, the NOR gate 410C may be configured in a similar manner as the NOR gate 410A, and perform a NOR operation on prediction signals 215E, 215F. In addition, the NOR gate 410D may be configured in a similar manner as the NOR gate 410A, and perform a NOR operation on prediction signals 215G, 215H.

In one configuration, the NAND gate 420 includes input ports coupled to the output ports OUT_NORA, OUT_NORB, OUT_NORC, OUT_NORD of the NOR gates 410A, 410B, 410C, 410D, respectively, and the enable output port EN_OUT coupled to the enable port EN of the clock gating circuit 150. In this configuration, the NAND gate 420 may perform four-input NAND logic operation on the outputs of the NOR gates 410A, 410B, 410C, 410D to generate the trigger enable signal 135 at the enable output port EN_OUT. In one aspect, the NAND operation performed on the results of the NOR operations performed on the prediction signals 215A-215H renders the same result as an OR logic operation performed on the prediction signals 215A-215H.

Advantageously, performing eight or a larger number of bits of OR logic operation through two or more stages as shown in FIG. 4 can improve the speed of logic computations. In one example, an OR logic operation on eight-bits may be performed by eight-bit NOR gate and an inverter at the output of the eight-bit NOR gate. However, implementing the eight-bit NOR gate may increase the capacitive load and reduce the operation speed. By performing a large number (e.g., eight or higher) bits of OR logic operation through the two or more stages with a combination of the NOR operations and the NAND operation as shown in FIG. 4, the capacitive load can be reduced such that the operation speed can be improved.

Figure 5:
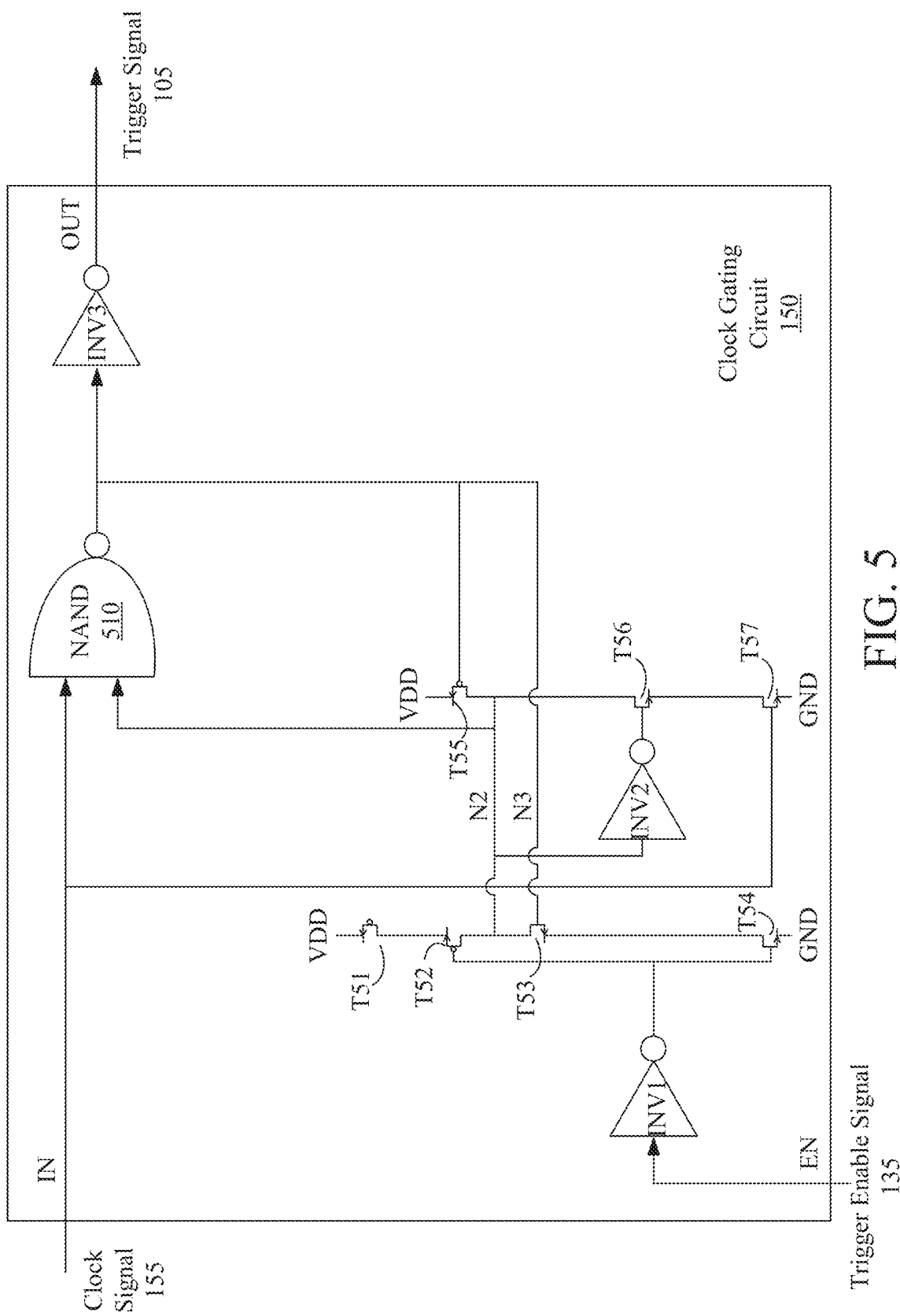
FIG. 5 is a schematic diagram of a clock gating circuit of the multi-bit storage system shown in FIG. 1, in accordance with some embodiments.

FIG. 5 is a schematic diagram of the clock gating circuit 150 of the multi-bit storage system 110 shown in FIG. 1, in accordance with some embodiments. In some embodiments, the clock gating circuit 150 includes inverters INV1, INV2, INV3, a NAND gate 510, and transistors T51, T52, T53, T54, T55, T56, T57. In some embodiments, the transistors T51, T52, T55 are implemented as P-type transistors (e.g., P-type MOSFETs or P-type FinFETs), and the transistors T53, T54, T56, T57 are implemented as N-type transistors (e.g., N-type MOSFETs or N-type FinFETs). These components may operate together to generate the trigger signal 105 according to the clock signal 155, in response to the trigger enable signal 135. In some embodiments, the clock gating circuit 150 includes more, fewer, or different components than shown in FIG. 5.

In one configuration, a first input port of the NAND gate 510 is coupled to the input port IN of the clock gating circuit 150, a second input port of the NAND gate 510 is coupled to a node N2, and an output port of the NAND gate 510 is coupled to a node N3. In one configuration, an input port of the inverter INV3 is coupled to the node N3, and an output port of the inverter INV3 is coupled to the output port OUT of the clock gating circuit 150. In one configuration, an input port of the inverter INV1 is coupled to the enable port EN of the clock gating circuit 150, and an output port of the inverter INV1 is coupled to gate electrodes of the transistors T52, T54. In one configuration, an input port of the inverter INV2 is coupled to the node N2, and an output port of the inverter INV2 is coupled to a gate electrode of the transistor T56.

In one configuration, a source electrode of the transistor T51 is coupled to a power rail VDD supplying a supply voltage, and a gate electrode of the transistor T51 is coupled to the input port IN of the clock gating circuit 150. In one configuration, a source electrode of the transistor T52 is coupled to a drain electrode of the transistor T51, and a drain electrode of the transistor T52 is coupled to the node N2. In one configuration, a drain electrode of the transistor T53 is coupled to the node N2 and a gate electrode of the transistor T53 is coupled to the node N3. In one configuration, a drain electrode of the transistor T54 is coupled to a source electrode of the transistor T53, and a source electrode of the transistor T54 is coupled to a ground rail GND supplying a ground voltage. In one configuration, a source electrode of the transistor T55 is coupled to the power rail VDD, a gate electrode of the transistor T55 is coupled to the node N3, and a drain electrode of the transistor T55 is coupled the node N2. In one configuration, a drain electrode of the transistor T56 is coupled to the node N2 and a source electrode of the transistor T56 is coupled to a drain electrode of the transistor T57. In one configuration, a gate electrode of the transistor T57 is coupled to the input port IN of the clock gating circuit 150 and a source electrode of the transistor T57 is coupled to the ground rail GND.

In this configuration, the clock gating circuit 150 generates the trigger signal 105 at the output port OUT, according to the clock signal 155 at the input port IN, based on the trigger enable signal 135 at the enable port EN. In one aspect, in response to the trigger enable signal 135 having the first state (e.g., logic value '1'), the clock gating circuit 150 may be enabled. When the clock gating circuit 150 is enabled, the clock gating circuit 150 may output the trigger signal 105 having the second state (e.g., logic value '0') and wait for a rising edge of the clock signal 155 at the input port IN. While the clock gating circuit 150 is enabled, in response to the rising edge of the clock signal 155, the clock gating circuit 150 may change a state of the trigger signal 105. For example, the trigger signal 105 may transition from the second state (e.g., logic value '0') to the first state (e.g., logic value '1') according to the clock signal 155. In one aspect, a rising edge of the trigger signal 105 prompts or causes the storage circuits 120A . . . 120N to update the outputs bits Out_A . . . Out_N according to corresponding input bits In_A . . . In_N. After updating the output bits Out_A . . . Out_N, the trigger enable signal 135 may be set to the second state (e.g., logic value '0') to disable the clock gating circuit 150. When the clock gating circuit 150 is disabled, the clock gating circuit 150 may wait for a falling edge of the clock signal 155. In response to the falling edge of the clock signal 155 while the clock gating circuit 150 is disabled, the clock gating circuit 150 may output the second state (e.g., logic value '0') as the trigger signal 105. While the clock gating circuit 150 is disabled, the clock gating circuit 150 may not wait for or respond to the rising edge of the clock signal 155.

Advantageously, the clock gating circuit 150 dynamically or adaptively generates or adjusts the trigger signal 105, in response to the trigger enable signal 135 indicating whether at least one of the output bits Out_A . . . Out_N is predicted to change a state or not. By dynamically or adaptively generating the trigger signal 105, in response to a prediction on whether at least one of the output bits Out_A . . . Out_N is predicted to change a state or not, a number of toggles of the trigger signal 105 can be reduced compared to the number of toggles of the clock signal 155. Hence, the clock gating circuit 150 may drive the storage circuits 120A . . . 120N in a power efficient manner.

Figure 6:
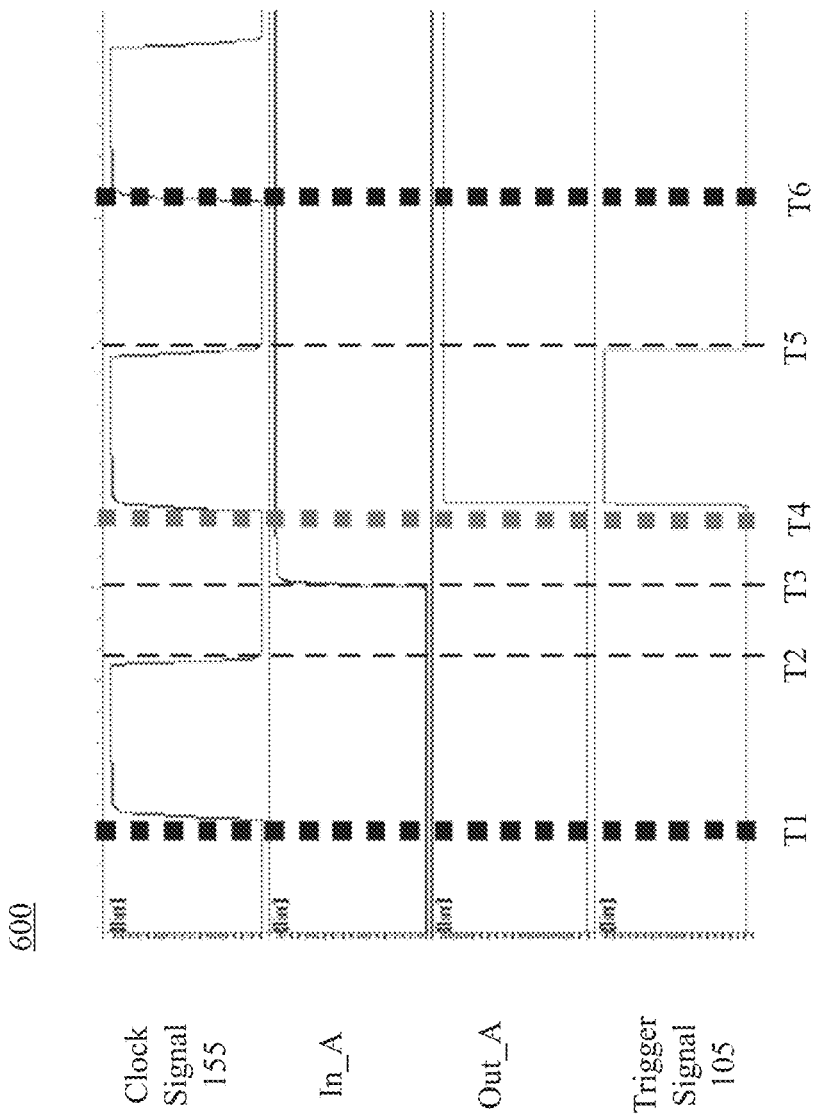
FIG. 6 is an example timing diagram of an operation of a multi-bit storage system, in accordance with some embodiments.

FIG. 6 is an example timing diagram 600 of an operation of a multi-bit storage system 110, in accordance with some embodiments. For simplicity, the timing diagram 600 shows an operation of a single storage circuit 120A. However, the operation shown in the timing diagram 600 can be applied to multiple storage circuits 120A . . . 120N.

In one aspect, the clock signal 155 includes a plurality of periodic pulses. For example, at time T1, the clock signal 155 toggles from a second state (e.g., 0V or logic '0') to a first state (e.g., 1V or logic value '1'). At time T1, because the state of the input bit In_A is same as the state of the output bit Out_A, the prediction circuit 130 may predict that the output bit Out_A will remain unchanged. Moreover, the prediction circuit 130 may generate the toggle enable signal 135 having the second state (e.g., logic value '0') to disable the clock gating circuit 150. Because the trigger enable signal 135 has the second state, the clock gating circuit 150 may be disabled, and may not respond to rising edge of the clock signal at time T1. Moreover, the clock gating circuit 150 may output the trigger signal 105 having the second state, causing the storage circuit 120A to maintain the output bit Out_A.

At time T2, the clock signal 155 toggles from the first state to the second state. While the clock gating circuit 150 is disabled, in response to the falling edge of the clock signal 155, the clock gating circuit 150 may set the trigger signal 105 to the second state (e.g., logic value '0'). Because the state of the trigger signal 105 before time T2 is the second state, the clock gating circuit 150 maintains the trigger signal 105 to have the second state, responsive to the falling edge of the clock signal 155 at time T2.

At time T3, the input bit In_A toggles from the second state (e.g., logic value '0') to the first state (e.g., logic value '1'). Because the state of the input bit In_A is different from the state of the output bit Out_A at time T3, the prediction circuit 130 may determine that the output bit Out_A is predicted to be changed. Moreover, the prediction circuit 130 may generate the toggle enable signal 135 having the first state (e.g., logic value '1') to enable the clock gating circuit 150. Because the clock gating circuit 150 is enabled, the clock gating circuit 150 may wait for a rising edge of the clock signal 155. Until detecting the rising edge of the clock signal 155, the storage circuit 120A may maintain the output bit Out_A.

At time T4, the clock signal 155 toggles from the second state to the first state, while the clock gating circuit 150 is enabled. Because the clock gating circuit 150 is enabled at time T4 while the clock gating circuit 150 is enabled, the clock gating circuit 150 may change a state of the trigger signal 105 from the second state to the first state. Hence, the trigger signal 105 may have a rising edge at time T4. In one aspect, the storage circuit 120A may detect the rising edge of the trigger signal 105 at time T4, and update the output bit Out_A according to the input bit In_A. For example, the state of the output bit Out_A toggles from the second state to the first state at time T4, in response to the rising edge of the trigger signal 105. After updating the output bit Out_A, the trigger enable signal 135 may be set to the second state to disable the clock gating circuit 150, because the input bit In_A and the output bit Out_A of the storage circuit 120A have the same state. When the clock gating circuit 150 is disabled, the clock gating circuit 150 may wait for a falling edge of the clock signal 155. While waiting for the falling edge of the clock signal 155, the storage circuit 120A may maintain the output bit Out_A.

At time T5, while the clock gating circuit 150 is disabled, the clock gating circuit 150 detects the falling edge of the clock signal 155. In response to detecting the falling edge of the clock signal 155 at time T5 while the clock gating circuit 150 is disabled, the clock gating circuit 150 may set or change the state of the trigger signal 105 from the first state to the second state.

At time T6, the clock signal 155 toggles from the second state to the first state. Because the clock gating circuit 150 is disabled at time T6, the clock gating circuit 150 may not respond to the rising edge of the clock signal 155 and maintain the trigger signal 105 having the second state. Hence, the storage circuit 120A may not update the output bit Out_A at time T6.

Figure 7:
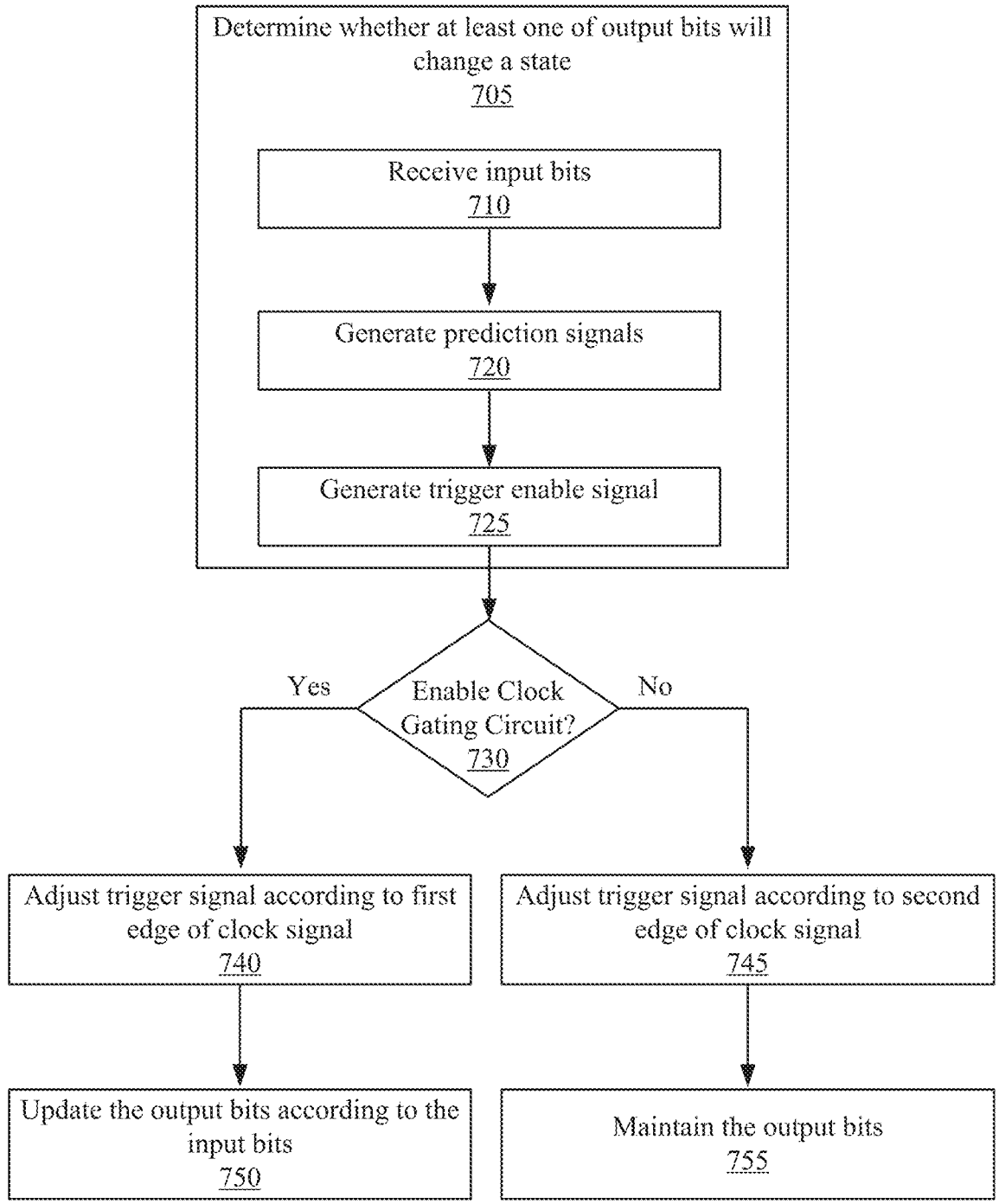
FIG. 7 is a flowchart of a method of operation of a multi-bit storage system, in accordance with some embodiments.

FIG. 7 is a flowchart of a method 700 of operation of the multi-bit storage system 110, in accordance with some embodiments. The method 700 may be performed by the multi-bit storage system 110 of FIG. 1. In some embodiments, the method 700 is performed by other entities. In some embodiments, the method 700 includes more, fewer, or different steps than shown in FIG. 7.

In an operation 705, the multi-bit storage system 110 determines whether outputs bits (e.g., output bits Out_A . . . Out_N) of storage circuits (e.g., storage circuits 120A . . . 120N) is predicted to change a state. In one aspect, the operation 705 includes operations 710, 720, 725.

In the operation 710, the multi-bit storage system 110 receives input bits (e.g., input bits In_A . . . In_N) of the storage circuits (e.g., storage circuits 120A . . . 120N). Each storage circuit 120X may be a flip flop circuit or a latch circuit. Each storage circuit 120X may receive a corresponding input bit In_X.

In the operation 720, the multi-bit storage system 110 including a prediction circuit (e.g., the prediction circuit 130) generates prediction signals (e.g., prediction signals 215A . . . 215N). Each prediction signal (e.g., prediction signal 215X) may indicate whether an output bit (e.g., output bit Out_X) of a corresponding storage circuit (e.g., storage circuit 120X) is predicted to change a state. In one approach, the prediction circuit 130 compares an input bit (e.g., input bit In_X) and an output bit (e.g., output bit Out_X) of the corresponding storage circuit (e.g., storage circuit 120X) to determine whether the state of the output bit is predicted to change or not. For example, in response to the state of the input bit (e.g., input bit In_X) and the state of the output bit (e.g., output bit Out_X) being equal to each other, the prediction circuit 130 may determine that the state of the output bit (e.g., output bit Out_X) is predicted to remain unchanged. For example, in response to the state of the input bit (e.g., input bit In_X) and the state of the output bit (e.g., output bit Out_X) being different, the prediction circuit 130 may determine that the state of the output bit (e.g., output bit Out_X) is predicted to be changed.

In the operation 725, the multi-bit storage system 110 including the prediction circuit (e.g., the prediction circuit 130) generates a trigger enable signal (e.g., the trigger enable signal 135), according to the prediction signals (e.g., prediction signals 215A . . . 215N) from the operation 720. In one aspect, the trigger enable signal (e.g., the trigger enable signal 135) indicates whether to enable or disable the clock gating circuit 150. In one approach, the prediction circuit 130 generates the trigger enable signal (e.g., the trigger enable signal 135) having a first state (e.g., logic value '1'), in response to at least one prediction signal (e.g., prediction signal 215X) of the prediction signals (e.g., prediction signals 215A . . . 215N) indicating that a state of an output bit (e.g., output bit Out_X) of the corresponding storage circuit (e.g., storage circuit 120X) is predicted to be changed. In one approach, the prediction circuit 130 generates the trigger enable signal (e.g., the trigger enable signal 135) having a second state (e.g., logic value '0'), in response to the prediction signals (e.g., prediction signals 215A . . . 215N) indicating that states of the output bits (e.g., output bits Out_A . . . Out_N) of the storage circuits (e.g., storage circuits 120A . . . 120N) are predicted to be unchanged.

In an operation 730, multi-bit storage system 110 (e.g., the prediction circuit 130) enables or disables the clock gating circuit 150 according to the trigger enable signal (e.g., trigger enable signal 135) from the operation 725. In one example, the prediction circuit 130 provides the trigger enable signal 135 having the first state (e.g., logic value '1') to the clock gating circuit 150 for enabling the clock gating circuit 150. In one example, the prediction circuit 130 provides the trigger enable signal having the second state (e.g., logic value '0') to the clock gating circuit 150 for disabling the clock gating circuit 150.

In an operation 740, in response to enabling the clock gating circuit 150, the multi-bit storage system 110 including the clock gating circuit (e.g., the clock gating circuit 150) sets or adjusts a trigger signal (e.g., the trigger signal 105), according to a first edge of a clock signal (e.g., the clock signal 155). In one approach, in response to enabling the clock gating circuit 150, the clock gating circuit 150 may wait for a rising edge of the clock signal 155. While waiting for the rising edge of the clock signal 155, the clock gating circuit 150 may set or maintain the trigger signal 105 or have the second state (e.g., logic value '0'). In response to detecting the rising edge of the clock signal 155 while the clock gating circuit 150 is enabled, the clock gating circuit 150 may change or adjust a state of the trigger signal 105 from the second state (e.g., logic value '0') to the first state (e.g., logic value '1').

In an operation 750, in response to the trigger signal (e.g., the trigger signal 105), the multi-bit storage system 110 including the storage circuits (e.g., the storage circuits 120A . . . 120N) may update the output bits (e.g., the output bits Out_A . . . Out_N) of the storage circuits, according to the input bits (e.g., the input bits In_A . . . In_N). In one approach, each storage circuit 120X may receive the trigger signal 105 from the operation 750, and update an output bit Out_X according to the input bit In_X. For example, the storage circuit 120X may replace the output bit Out_X with the input bit In_X, in response to a rising edge of the trigger signal 105. After updating the output bits, the multi-bit storage system 110 may return to the operation 705.

In an operation 745, in response to disabling the clock gating circuit 150, the multi-bit storage system 110 including the clock gating circuit 150 (e.g., the clock gating circuit 150) sets or adjusts the trigger signal (e.g., the trigger signal 105), according to a second edge of the clock signal (e.g., the clock signal 155). In one approach, in response to disabling the clock gating circuit 150, the clock gating circuit 150 may wait for a falling edge of the clock signal 155. In response to detecting the falling edge of the clock signal 155, the clock gating circuit 150 may set or maintain the trigger signal 105 to have the second state (e.g., logic value '0').

In an operation 755, in response to the trigger signal (e.g., the trigger signal 105) having the second state (e.g., logic value '0') without a rising edge, the multi-bit storage system 110 including the storage circuits (e.g., the storage circuits 120A . . . 120N) may maintain the output bits (e.g., the output bits Out_A . . . Out_N). While maintaining the output bits (e.g., the output bits Out_A . . . Out_N), the multi-bit storage system 110 may execute the operation 705 and/or the operation 730, until the trigger signal (e.g., trigger signal 105) is updated to have a rising edge in the operation 740 in response to any change in the input bits.

Advantageously, the clock gating circuit 150 dynamically or adaptively generates or adjusts the trigger signal 105, in response to the trigger enable signal 135 indicating whether at least one of the output bits Out_A . . . Out_N is predicted to change a state or not. By dynamically or adaptively generating the trigger signal 105, in response to a prediction on whether at least one of the output bits Out_A . . . Out_N is predicted to change a state or not, a number of toggles of the trigger signal 105 can be reduced compared to the number of toggles of the clock signal 155. Hence, the clock gating circuit 150 may drive the storage circuits 120A . . . 120N in a power efficient manner.

Figure 8:
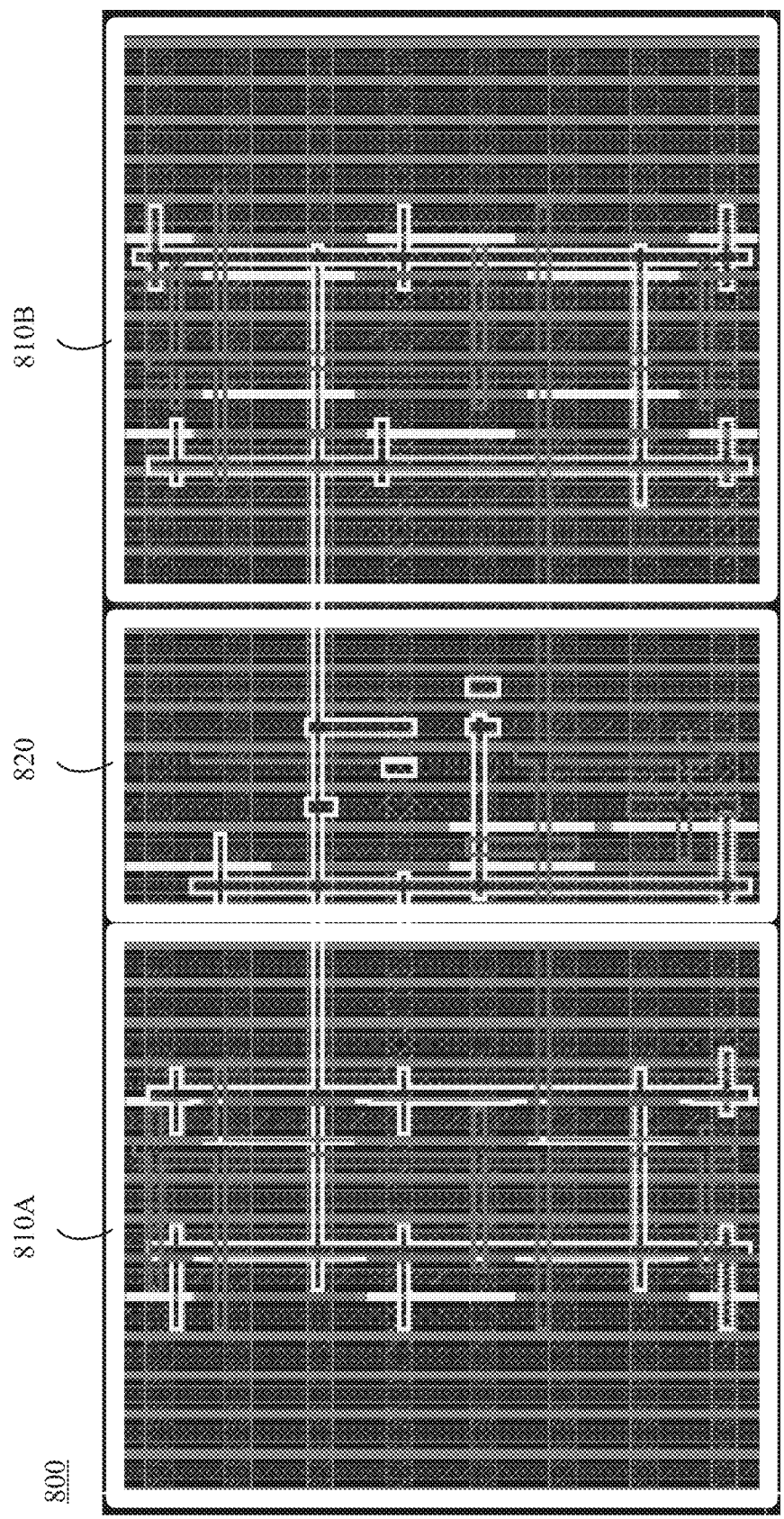
FIG. 8 is an example layout diagram of a multi-bit storage system, in accordance with some embodiments.

FIG. 8 is an example layout diagram of the multi-bit storage system 110 of FIG. 1, in accordance with some embodiments. In some embodiments, the multi-bit storage system 110 includes even number of storage circuits 120A . . . 120N. In one aspect, a first set of the storage circuits 120A . . . 120N is disposed in a first region 810A, and a second set of the storage circuits 120A . . . 120N is disposed in a second region 810B, where the prediction circuit 130 and the clock gating circuit 150 are disposed in a third region 820 between the first region 810A and the second region 810B. By disposing the prediction circuit 130 and the clock gating circuit 150 between the first set of the storage circuits 120A . . . 120N and the second set of the storage circuit 120A . . . 120N, a distance between a storage circuit farthest away from the prediction circuit 130 and the clock gating circuit 150 can be reduced. Accordingly, a delay due to logic computations performed by the prediction circuit 130 and the clock gating circuit 150 can be reduced.

Figure 9:
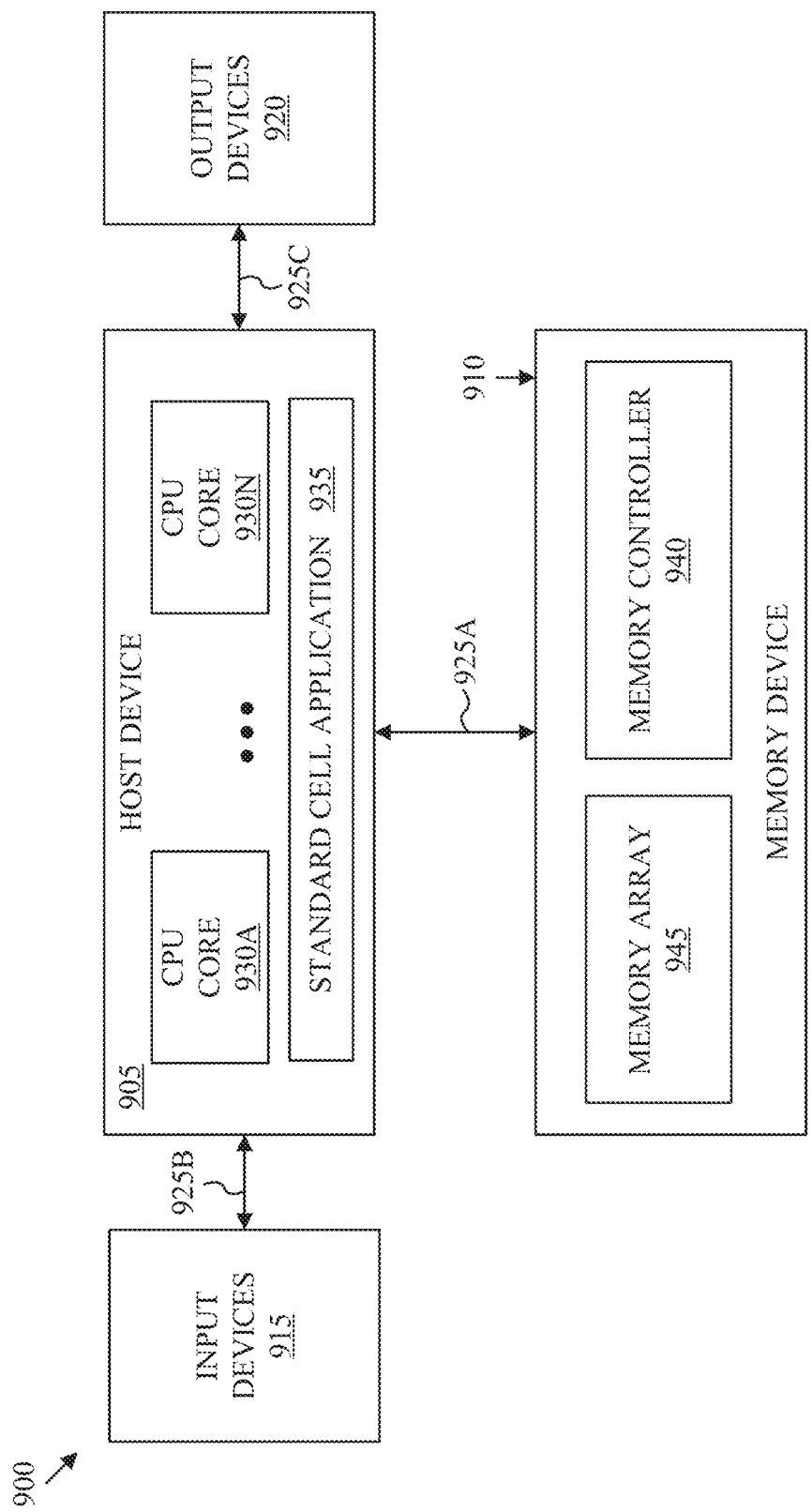
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device 905 and send instructions to the host device 905. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device 905 may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the multi-bit storage system 110 or a portion of the multi-bit storage system 110. After the layout design of the integrated circuit is complete, multiples of the integrated circuit, for example, including the multi-bit storage system 110 or a portion of the multi-bit storage system 110 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array 945 in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to an integrated circuit. In some embodiments, the integrated circuit includes a first storage circuit to update a first output bit according to a first input bit, in response to a trigger signal. In some embodiments, the integrated circuit includes a second storage circuit to update a second output bit according to a second input bit, in response to the trigger signal. In some embodiments, the integrated circuit includes a prediction circuit coupled to the first storage circuit and the second storage circuit. The prediction circuit may generate a trigger enable signal indicating whether at least one of the first output bit or the second output bit is predicted to change a state. In some embodiments, the integrated circuit includes a clock gating circuit coupled to the prediction circuit. The clock gating circuit may generate the trigger signal based on the trigger enable signal.

One aspect of this description relates to an integrated circuit. In some embodiments, the integrated circuit includes a first storage circuit to update a first output bit according to a first input bit, in response to a trigger signal. In some embodiments, the integrated circuit includes a second storage circuit to update a second output bit according to a second input bit, in response to the trigger signal. In some embodiments, the integrated circuit includes a prediction circuit coupled to the first storage circuit and the second storage circuit. In some embodiments, the prediction circuit is to predict whether a state of the first output bit is predicted to be changed and predict whether a state of the second output bit is predicted to be changed. In some embodiments, the prediction circuit is to generate a trigger enable signal, according to the prediction on whether the state of the first output bit is predicted to be changed and the prediction on whether the state of the second output bit is predicted to be changed. The trigger signal may be generated based at least in part on the trigger enable signal.

One aspect of this description relates to a method of operating a multi-bit storage system. In one approach, the method includes determining whether at least one of output bits of a plurality of flip flop circuits is predicted to change a state. In one approach, the method includes enabling a clock gating circuit, in response to determining that the at least one of output bits of the plurality of flip flop circuits is predicted to change the state. In one approach, the method includes adjusting a trigger signal from a first state to a second state according to a first edge of a clock signal, while the clock gating circuit is enabled. In one approach, the method includes updating one or more of the output bits of the plurality of flip flop circuits according to one or more corresponding input bits, in response to the trigger signal changing from the first state to the second state. In one approach, the method includes disabling the clock gating circuit, in response to determining that the output bits of the plurality of flip flop circuits are predicted to remain unchanged. In one approach, the method includes resetting the state of the trigger signal to the second state, according to a second edge of the clock signal, while the clock gating circuit is disabled. In one aspect, the first edge of the clock signal is one of a rising edge and a falling edge of the clock signal, and wherein the second edge of the clock signal is the other of the rising edge and the falling edge of the clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a first storage circuit to update a first output bit according to a first input bit, in response to a trigger signal;
    a second storage circuit to update a second output bit according to a second input bit, in response to the trigger signal;
    a prediction circuit coupled to the first storage circuit and the second storage circuit, the prediction circuit to generate a trigger enable signal indicating whether at least one of the first output bit or the second output bit is predicted to change a state; and
    a clock gating circuit coupled to the prediction circuit, the clock gating circuit including an AND gate and a set of transistors coupled to the AND gate, the set of transistors to detect an edge of a clock signal, wherein the clock gating circuit is to:
        generate the trigger signal having a first state, according to a first edge of the clock signal, based on the trigger enable signal, and
        maintain the trigger signal having the first state until a second edge of the clock signal subsequent to the first edge.

2. The integrated circuit of claim 1, wherein the clock gating circuit is to:
    adjust the trigger signal according to a rising edge of the clock signal, in response to the trigger enable signal indicating that the at least one of the first output bit or the second output bit is predicted to change the state, and
    adjust the trigger signal according to a falling edge of the clock signal, in response to the trigger enable signal indicating that i) a state of the first output bit is predicted to be unchanged, and ii) a state of the second output bit is predicted to be unchanged.

3. The integrated circuit of claim 1, wherein the prediction circuit is to:
    generate a first prediction signal indicating whether a state of the first output bit is predicted to be changed, and
    generate a second prediction signal indicating whether a state of the second output bit is predicted to be changed.

4. The integrated circuit of claim 3, wherein the prediction circuit includes:
    an OR gate including:
        input ports coupled to the first storage circuit and the second storage circuit, and
        an output port coupled to the clock gating circuit, the OR gate to receive the first prediction signal and the second prediction signal at the input ports, and generate the trigger enable signal at the output port according to at least one of the first prediction signal or the second prediction signal.

5. The integrated circuit of claim 4, wherein the OR gate is to:
    generate the trigger enable signal having a second state indicating that at least one of the state of the first output bit or the state of the second output bit is predicted to be changed, in response to at least one of i) the first prediction signal indicating that the state of the first output bit is predicted to be changed, or ii) the second prediction signal indicating that the state of the second output bit is predicted to be changed, and
    generate the trigger enable signal having a third state indicating that the state of the first output bit and the state of the second output bit are predicted to remain unchanged, in response to i) the first prediction signal indicating that the state of the first output bit is predicted to be unchanged, and ii) the second prediction signal indicating that the state of the second output bit is predicted to be unchanged.

6. The integrated circuit of claim 4, wherein the prediction circuit further includes:
    an XOR gate including:
        a first input port coupled to an input port of the first storage circuit, the first input port to receive the first input bit,
        a second input port coupled to an output port of the first storage circuit, the second input port to receive the first output bit from the output port of the first storage circuit, and
        an output port coupled to one of the input ports of the OR gate, the output port of the XOR gate to output the first prediction signal, according to the first input bit and the first output bit.

7. The integrated circuit of claim 6, wherein the XOR gate is to:
    compare the first input bit received at the first input port of the XOR gate and the first output bit received at the second input port of the XOR gate, and generate the first prediction signal at the output port of the XOR gate according to the comparison.

8. The integrated circuit of claim 7, wherein the XOR gate is to:
generate the first prediction signal having a second state indicating that the state of the first output bit is predicted to be changed, in response to the first input bit and the first output bit being different, and
generate the first prediction signal having a third state indicating that the state of the first output bit is predicted to be unchanged, in response to the first input bit and the first output bit being equal to each other.

9. The integrated circuit of claim 1, wherein the prediction circuit and the clock gating circuit are disposed between the first storage circuit and the second storage circuit.

10. The integrated circuit of claim 1, wherein the AND gate includes a NAND gate and an inverter circuit coupled to an output of the NAND gate, wherein the set of transistors is coupled to an input of the NAND gate and the output of the NAND gate.

11. An integrated circuit comprising:
a first storage circuit to update a first output bit according to a first input bit, in response to a trigger signal;
a second storage circuit to update a second output bit according to a second input bit, in response to the trigger signal;
a prediction circuit coupled to the first storage circuit and the second storage circuit, the prediction circuit to:
predict whether a state of the first output bit is predicted to be changed,
predict whether a state of the second output bit is predicted to be changed, and
generate a trigger enable signal, according to the prediction on whether the state of the first output bit is predicted to be changed and the prediction on whether the state of the second output bit is predicted to be changed, the trigger signal generated based at least in part on the trigger enable signal; and
a clock gating circuit coupled to the first storage circuit and the second storage circuit, wherein the clock gating circuit includes an AND gate and a set of transistors coupled to the AND gate, the set of transistors to detect an edge of a clock signal, wherein the clock gating circuit is to:
adjust the trigger signal according to a first edge of the clock signal and the trigger enable signal, and
maintain the adjusted trigger signal until a second edge of the clock signal subsequent to the first edge.

12. The integrated circuit of claim 11, wherein the clock gating circuit is to:
adjust the trigger signal according to a rising edge of the clock signal, in response to the trigger enable signal indicating that at least one of i) the state of the first output bit is predicted to be changed, or ii) the state of the second output bit is predicted to be changed, and
adjust the trigger signal according to a falling edge of the clock signal, in response to the trigger enable signal indicating that i) the state of the first output bit is predicted to be unchanged, and ii) the state of the second output bit is predicted to be unchanged.

13. The integrated circuit of claim 12, wherein the first storage circuit includes:
a flip flop circuit including:
an input port to receive the first input bit,
a clock port coupled to the clock gating circuit, the clock port to receive the trigger signal from the clock gating circuit, and
an output port to provide the first output bit.

14. The integrated circuit of claim 13, wherein the prediction circuit includes:
an XOR gate including:
a first input port coupled to the input port of the flip flop circuit, the first input port to receive the first input bit,
a second input port coupled to the output port of the flip flop circuit, the second input port to receive the first output bit from the output port of the flip flop circuit, and
an output port to output a first prediction signal indicating whether a state of the first output bit is predicted to be changed, according to the first input bit and the first output bit, the trigger enable signal generated based at least in part on the first prediction signal.

15. The integrated circuit of claim 14, wherein the XOR gate is to:
compare the first input bit received at the first input port of the XOR gate and the first output bit received at the second input port of the XOR gate, and
generate the first prediction signal according to the comparison.

16. The integrated circuit of claim 12, wherein the prediction circuit and the clock gating circuit are disposed between the first storage circuit and the second storage circuit.

17. The integrated circuit of claim 11, wherein the AND gate includes a NAND gate and an inverter circuit coupled to an output of the NAND gate, wherein the set of transistors is coupled to an input of the NAND gate and the output of the NAND gate.

18. A method comprising:
determining whether at least one of output bits of a plurality of flip flop circuits is predicted to change a state;
enabling a clock gating circuit including an AND gate and a set of transistors coupled to the AND gate, the set of transistors to detect an edge of a clock signal, in response to determining that the at least one of output bits of the plurality of flip flop circuits is predicted to change the state;
adjusting, by the clock gating circuit, a trigger signal from a first state to a second state according to a first edge of the clock signal, while the clock gating circuit is enabled;
maintaining, by the clock gating circuit, the second state of the trigger signal, until a second edge of the clock signal subsequent to the first edge; and
updating one or more of the output bits of the plurality of flip flop circuits according to one or more corresponding input bits, in response to the trigger signal changing from the first state to the second state.

19. The method of claim 18, further comprising:
disabling the clock gating circuit, in response to determining that the output bits of the plurality of flip flop circuits are predicted to remain unchanged; and
resetting the state of the trigger signal to the first state, according to a second edge of the clock signal, while the clock gating circuit is disabled.

20. The method of claim 19, wherein the first edge of the clock signal is one of a rising edge and a falling edge of the clock signal, and wherein the second edge of the clock signal is the other of the rising edge and the falling edge of the clock signal.

\* \* \* \* \*